United States Patent [19]

Takigawa

[11] 4,199,689

[45] Apr. 22, 1980

[54] ELECTRON BEAM EXPOSING METHOD AND ELECTRON BEAM APPARATUS

[75] Inventor: Tadahiro Takigawa, Inagi, Japan

[73] Assignee: Tokyo Shibaura Denki Kabushiki Kaisha, Kawasaki, Japan

[21] Appl. No.: 971,043

[22] Filed: Dec. 19, 1978

[30] Foreign Application Priority Data

Dec. 21, 1977 [JP] Japan .................................. 52-154090
Dec. 27, 1977 [JP] Japan .................................. 52-159919

[51] Int. Cl.² ............................................. H01J 37/00
[52] U.S. Cl. ................................. 250/492 A; 250/358; 219/121 EB
[58] Field of Search ........... 250/492 A, 492 B, 396 R, 250/398; 313/361, 359; 219/121 EB, 121 EM

[56] References Cited

U.S. PATENT DOCUMENTS

| | | | |
|---|---|---|---|
| 2,860,251 | 11/1958 | Pakswer et al. | 250/492 A |
| 3,956,635 | 5/1976 | Chang | 250/492 A |
| 4,013,891 | 3/1977 | Ko et al. | 250/492 A |

OTHER PUBLICATIONS

"Characteristics of the Hot Cathode Electron Microscope Gun," *British Journal of App. Physics,* Haime et al., vol. 3, pp. 40–46, Feb. 1952.
"Emission Characteristics of Lab. Electron Gun," Stichel et al., *American Vacuum Society,* Proc. 12th Symp. Electron Ion Laser Beam Technol., A15–A18, 1973.

*Primary Examiner*—Bruce C. Anderson
*Attorney, Agent, or Firm*—Oblon, Fisher, Spivak, McClelland & Maier

[57] ABSTRACT

The diameter of an electron beam at a crossover point can be set to a predetermined value by adjusting a heater current through a heater of an electron gun and a voltage between an emitter of the electron gun and wehnelt electrode. The diameter of the electron beam incident onto an object to be exposed can be varied by varying the diameter of the electron beam at the crossover point. This can be done without adjusting an electron beam lens and deflection electrode of an electron beam exposing apparatus. The diameter of the electron beam incident onto an object to be exposed can be set to a predetermined value dependent upon a pattern to be described.

12 Claims, 8 Drawing Figures

ELECTRON BEAM EXPOSING METHOD AND ELECTRON BEAM APPARATUS

BACKGROUND OF THE INVENTION

This invention relates to an electron beam exposing method and electron beam exposing apparatus.

Electron beam exposing apparatus is adapted to project electron beam on a predetermined area of a photoresist layer on a semiconductor wafer or an IC or LSI pattern mask to describe a desired pattern on the photoresist layer. It is required that the electron beam exposing apparatus can accurately describe a desired pattern with high precision. In such apparatus it is said that the faster the describing speed the better. In order to enhance the pattern accuracy, the width of electron beams projected onto the photoresist is made relatively small, for example, of the order of about 0.5 μm. It is true that if the width of the beam diameter is made smaller a pattern can be sufficiently accurately described, but it takes a longer time to describe a predetermined pattern, since the smaller beam diameter and thus the smaller unit exposure area (i.e., the limit exposure area when the electron beam is projected on the photoresist layer without being deflected) are involved. Thus, there is a problem in the prior art that a describing speed is slow. A pattern to be described usually includes not only a circuit pattern to be exactly described, but also a mark pattern such as a manufacture number, manufacture date and pattern data which is sufficient, if legible, and which is not required to be enough accurate. In this case, an unnecessarily longer describing time or exposure time is required, because even the mark pattern must be described by an electron beam of smaller diameter.

SUMMARY OF THE INVENTION

It is accordingly an object of this invention to provide an electron beam exposing method and electron beam exposing apparatus which can describe a desired pattern quickly and accurately.

According to one aspect of this invention there is provided electron beam exposing apparatus comprising an electron gun for emitting an electron beam, an electron lens system for focussing the electron beam, a table on which an object to be exposed is placed, blanking means for selectively blocking passage of the electron beam to permit the object on the table to be selectively exposed, deflecting means for deflecting the electron beam in a predetermined direction to permit an exposure area of the electron beam to be varied, means for controlling the electron gun to permit the diameter of the electron beam at a crossover point which is emitted from the electron gun to be varied, and means for designating the value of the beam diameter to the electron beam diameter controlling means according to the pattern area of the object.

According to another aspect of this invention there is provided an electron beam exposing method comprising the steps of beforehand storing data on the shape of a pattern of an object to which an electron beam is exposed, data on the position on the object and data on the diameter of the electron beam associated with a given position on the object to means for controlling the diameter of the electron beam at a crossover point to cause the diameter of the electron beam to be set to a predetermined value to permit the resultant electron beam from an electron gun to be focussed at said crossover point, and exposing the electron beam onto the object according to the data on the shape of the pattern which is associated with the position data.

BRIEF DESCRIPTION OF THE DRAWINGS

This invention will be further described by way of example by referring to the accompanying drawings in which.

DETAILED DESCRIPTION OF THE PREFERRED EMBODIMENTS

Figure 1:
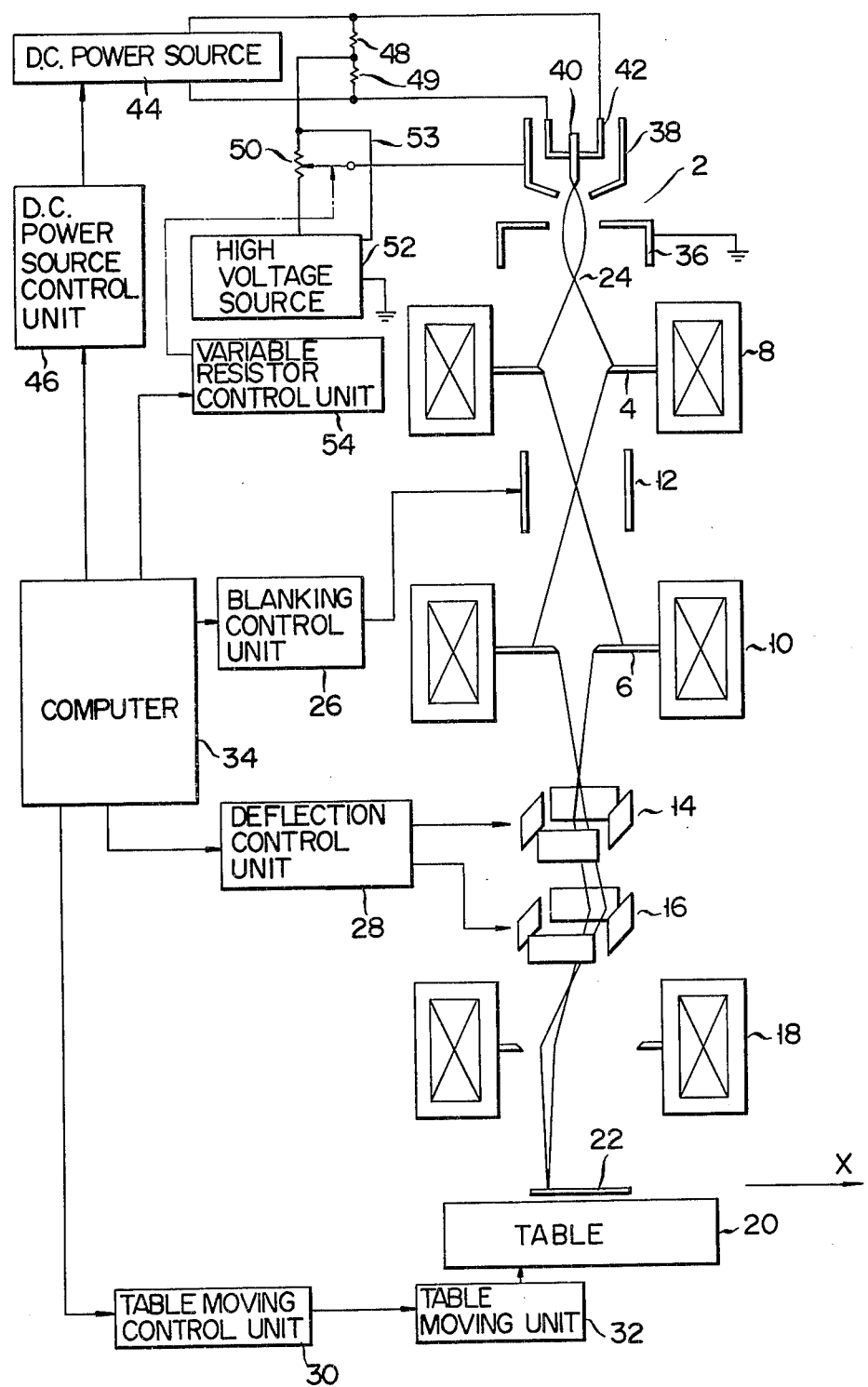
FIG. 1 is a block diagram schematically showing electron beam exposing apparatus of this invention.
Figure 2:
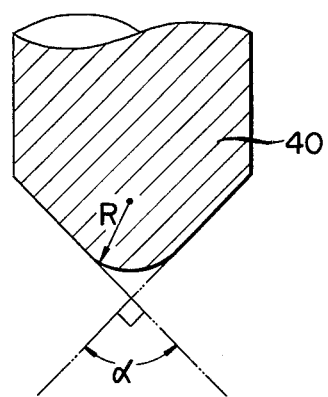
FIG. 2 is a schematic front view, partly broken away, showing the forward end portion of an emitter of an electron gun of the electron beam exposing apparatus.

Electron beam exposing apparatus as shown in FIG. 1 comprises an electron gun 2, first and second condenser electron lens 8 and 10 having aperture plates 4 and 6, respectively, a pair of blanking electrode 12, first and second deflection electrodes 14 and 16, a telecentric type objective electron lens 18 and a table 20 on which is disposed an object such as a wafter or a mask which is coated with a photoresist. In such electron beam exposing apparatus an electron beam emitted from the electron gun 2 is once focussed at a crossover point 24 and the electron beam is directed toward the first aperture plate 4 with the crossover point 24 as an electron beam source. The electron beam is focussed by the first condenser lens 8. The blanking electrodes 12 are arranged around the focussing position of the focussed electron beam, permitting passage of the electron beam through the second aperture plate 6 to be prevented by a blanking signal from the blanking control unit 26 and permitting the electron beam to be passed through the second aperture plate 6 by an unblanking or exposing signal from the blanking control unit 26. A predetermined voltage is normally applied between the blanking electrodes 12 and when an electric field is created therebetween the electron beam is deflected and cut by second a aperture plate thereby preventing passage of the electron beam. When, on the other hand, a predetermined voltage is not applied between the blanking electrodes the electron beam is not deflected and passed through the second aperture plate 6. The electron beam is focussed by the second condenser lens 10. The focussed electron beam is, while being diverged, directed toward a space around the first deflection electrodes 14. The first and second deflection electrodes 14 and 16 deflect the electron beam in the X or Y or X-Y direction by a deflection signal from the deflection control unit 28, causing the resultant electron beam to be directed toward a space between the objective lens 18. The objective lens 18 causes the electron beam to be directed, while being focussed, onto the surface portion of the mask such that it can be incident in a direction substantially vertical to the surface of the mask 22. In a raster scanning system, when scanning of the electron beam in one direction, for example, an X direction is completed, a table moving control unit 30, causing the table 20 to be moved continuously at a predetermined velocity in the Y direction (a direction perpendicular to the drawing sheet) so that scanning of the electron beam can be started at the constant interval. In a vector scanning system, when the illumination or exposure by the electron beam of a certain portion of the photoresist layer on the mask 22 is completed, stage is steped by the table moving control unit to permit exposure or illumination to be restarted. The blanking control unit 26, deflection control unit 28 and table moving control unit 30 receive an instruction signal from a computer 34 and are controlled by the computer 34 according to a pattern to be described on the photoresist layer on the mask 22. The electron beam exposing apparatus of this invention further includes the following constituent elements. An electron gun 2 usually comprises a grounded anode 36, a wehnelt electrode 38 to which a negative high voltage is applied, and an emitter or cathode 40 for emitting electrons. According to this invention, use is made as the emitter of a bar-like rectangular prism with a relatively sharp end as shown in FIG. 1 or 2. As a material for the emitter 40 use is made of, for example, a single crystal or sintered mass of lanthanum hexaboride (LaB6) or a thorium (Th)-bearing tungsten (W). The end of the emitter 40 has an inclination angle $\alpha$ of below 120°, usually about 90° and the tip of the end of the emitter is rounded to provide a radius of about 15$\mu$. The length of the emitter is a length of about 2 mm and the width of a body of the emitter is about 0.8 $\times$ 0.6 mm. The emitter 40 is supported by a heater 42, as shown in FIG. 1, which is made of for example pyrolitic graphite. The heater 42 is provided to cause the emitter 40 to be heated to permit thermoelectrons to be dissipated. To the heater 42 is connected, as shown in FIG. 1, a DC power source 44 for supplying heater current. The DC power source 44 has its output voltage varied by a DC power source control unit 46. The control unit 46 causes the output voltage of the DC power source 44 to be set to a predetermined value according to an operation mode designated by the computer 34. When the output voltage of the DC power source 44 is set to the predetermined value, a heater current flowing through the heater 42 evidently varies. Resistors 48, 49 are connected to the heater 42 as shown in FIG. 1. To a connecting point of the resistors 48, 49 is connected a high voltage source 52 grounded through a variable resistor 50. The connecting point is connected to the high voltage source 52 by a feedback line 53 so that a high potential on the connecting point is detected by the high voltage source 52. The high voltage source, even if the movable contact of the variable resistor is moved, provides a hight voltage to the variable resistor so as to cause a potential detected on the connecting point of resistor 48, 49 to be made constant, since the potential on the connecting point is maintained constant. The high voltage source 52 is connected to the wehnelt electrode 38 through the movable terminal of the variable resistor 50 so that a negative high voltage is supplied. Since the anode 2 is grounded, a high voltage is applied between the wehnelt electrode 38 and the anode 2 and a strong electric field is induced therebetween to permit electron beams emitted from the emitter 40 to be accelerated. The variable resistor 50 is provided to adjust a high voltage which is applied between the wehnelt 38 and the emitter 40. The movable terminal of the variable resistor is moved by the variable resistor control unit 54. The variable resistor control unit 54 sets the resistance of the variable resistor 50 to a predetermined value, thus causing a voltage supplied between the wehnelt electrode 38 and the emitter 40 having a constant potential to be set to a predetermined value.

Figure 3:
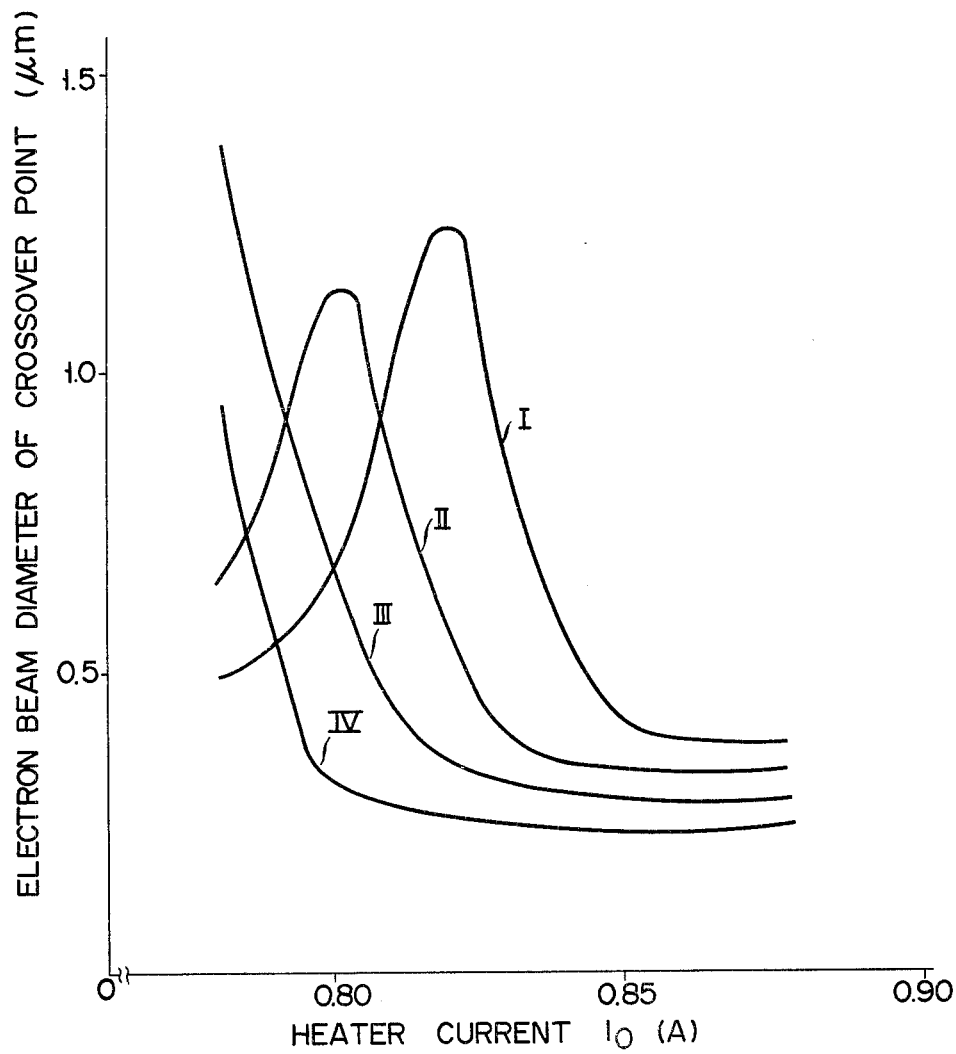
FIG. 3 is a graph showing a variation of the diameter of an electron beam.

With the apparatus so constructed, if a heater current through the heater 42 or a high voltage supplied between the emitter 40 and the wehnelt electrode 38 or both are adjusted, the width of an electron beam at the crossover point 24 is varied. Even in this case, the crossover point 24 is held always at a substantially fixed position. Since the crossover point which is regarded as an electron beam source of the first condenser lens 8 is so held, it is not necessary to adjust the lens systems 8 and 10 and deflection electrodes which are all arranged along the electron beam path. Even if the crossover point 24 is substantially fixed the diameter of the electron beam is varied. Thus, a projection image at the crossover point 24 is projected or exposed onto the photoresist layer on the mask 22 such that its size is varied i.e., the to-be-exposed area of the photoresist layer on the mask 22 is varied. In other words, the diameter of the electron beam incident onto the photoresist layer on the mask 22 is varied. A predetermined relation usually exists between the diameter of the incident electron beam and the beam current (i.e., the number of electrons) which is sent onto the photoresist layer on the mask 22. The beam current is proportional to the square of the diameter of the beam. That is, when the electron beam is double its size, the beam current i.e., the number of electrons will be 4-times as large as the diameter of the beam. The amount of electron beam exposed onto the photoresist layer is dependent upon the beam current i.e., the number of electrons. If the diameter of the electron beam incident onto the photoresist layer is increased, the exposure time can be decreased, because it is reversely proportional to the square of the diameter of the electron beam. Suppose, for example, that some area is exposed by an electron beam with a diameter of $D_1$ and with a diameter of $D_2$ (= $D_1 \times \frac{1}{2}$), respectively. In the former case, the exposure time will be sufficient at one-fourth the exposure time involved in the latter case. That is, the deflection control electrodes 14 and 16 can cause an electron beam involved in the former case to be deflected in the X direction at a speed about two times as fast as in the latter case, and the photoresist layer on the mask 22 is scanned in the former case at a speed two times as fast as in the latter case. The width of the photoresist layer exposed by one line of electron beam in the Y direction is, in the former case, two times as large as in the latter case. In order that an area as scanned once by the electron beam ($D_1$) in the X direction may be scanned by the electron beam ($D_2$), it is required that, after the scanning of the electron beam ($D_2$) is effected once in the X direction, the scanning of the electron beam ($D_2$) be effected in the Y direction after the table has been moved a distance $D_2$. When, therefore, a predetermined area is exposed by the electron beam ($D_1$), the exposure time will be decreased by the factor of 4 as compared with the latter case. The diameter of the electron beam at the crossover point is varied based on a variation of a heater current or a voltage between the emitter and wehnelt electrode. This will be explained in connection with a graph of FIG. 3. The graph of FIG. 3 is plotted under the following conditions:

the emitter 40: made of a single LaB6 (lanthanum hexaboride) crystal;
   the inclination angle α of the emitter: 90°;
   the radium of the rounded;
   tip of the emitter: 15μ;
   the length of the emitter: 2 mm;
   the width of the emitter: 6×8 μm;
   the acceleration voltage between;
   the wehnelt electrode 38;
   and the anode: 20 KV.

In this graph, the curve I is obtained when the variable resistor 50 has a resistance of 3.6 MΩ; the curve II, 4.2 MΩ; the curve III, 5.0 MΩ; and the curve IV, 6.8 MΩ. In the graph of FIG. 3 the width of the electron beam at the crossover is plotted as the ordinate, and the value of the heater current which varies with a variation of the applied voltage of the DC power source 44 is plotted as the abscissa. As evident from the graph of FIG. 3 the diameter of the electron beam is varied with a variation of the heater current $I_0$, even when the resistive value of the variable resistor 50 is constant. From FIG. 3 it will be understood that the diameter of the electron beam varies dependent upon the resistive value of the variable resistor 50. Even if the heater current $I_0$ is constant and the resistive value of the variable resistor 50 is constant, the diameter of the electron beam as indicated on the point on the curves I to IV varies. Thus, the diameter of the electron beam at the crossover point can be set to a proper value by determining the heater current $I_0$ and resistive value by the DC power source 44 and variable resistor 50 respectively. The computer 34 is of a well-known type and at least includes a CPU (central processing unit) and memory. The memory of the computer 34 stores pattern data to be described on the photoresist layer on the mask 22 on the table and position data indicated by the X, Y coordinate on the mask 22 on the table 22. The memory of the computer also stores data on the diameter of the electron beam at the crossover point and the corresponding position data. As already set out above, the operation mode (i.e. the value of the heater current and the value of a voltage between the emitter and the anode) is designated to the DC power source control unit 46 and variable resistor control unit 54 to cause the electron beam diameter to be set. The computer 34 sends the position data i.e. table moving signal and deflection signal to the deflection control unit 28 and table moving control unit 30 and a pattern signal (i.e. a blanking and unblanking signal) associated with the position data to the blanking control unit 36. An operation mode signal on the deflection speed of the electron beam is sent from the computer 34 to the deflection control unit 28. The deflection speed of the electron beam is controlled dependent upon the diameter of the electron beam. That is, the operation mode signal gives an instruction such that the greater the diameter of the electron beam the faster the deflection speed of the electron beam. Based on such instruction the deflection control unit 28 controls the deflection electrodes 14 and 16. The data stored in the memory of the computer will be more clarified by the electron beam exposing method which will be explained later.

The electron beam exposing method will now be explained below by referring to FIGS. 4A to 4C.

Figure 4A:
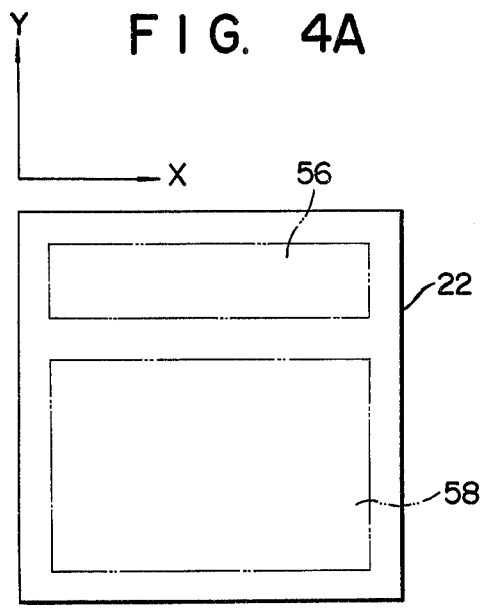
FIGS. 4A to 4C are an explanatory view showing an electron beam exposing method in which different diameters of electron beam are used.
Figure 4B:
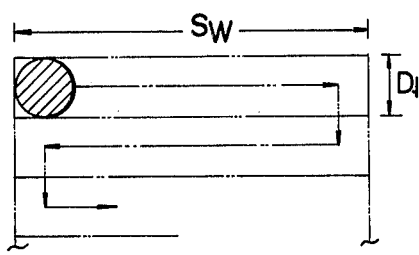
Figure 4C:
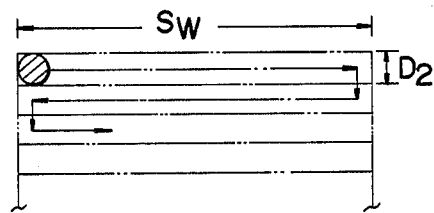

In FIG. 4A the photoresist layer on the mask or wafer 22 is shown divided into first and second areas 56 and 58 as indicated by broken lines. The first area 56 is an area in which a mark pattern such as an IC or LSI circuit pattern name, manufacture number and manufacture data is entered, and the second area 58 is an area in which an IC or LSI circuit pattern is entered (the configuration of the circuit pattern is emitted). The size of the first area 56 will be sufficient if a mark pattern to be entered is accurate enough to be legible irrespective of the mark pattern, and the size of the mark pattern is 10 μm at minimum. In contrast, the size of the second area 58 is required to be very accurate and is at least 0.5 μm, since the accuracy of the pattern imparts a direct influence to the characteristic of IC or LSI. According to this invention the above-mentioned two areas are exposed by different-diameter electron beams.

In a raster scanning system the areas 56 and 58 are exposed as will be described below. The first area 56 starts to be exposed at a first operation mode. That is, the computer 34 designates a first operation mode instruction to the DC power source control unit 46 and variable resistor control unit 54. The diameter of the electron beam at the crossover point is set to a predetermined value so that the diameter $D_1$ of the electron beam incident onto the photoresist layer on the mask 22 is set to, for example, 1.0 μm. The computer 34 inparts an instruction to the deflection control unit 28 such that a width SW, for example, 250 μm of the area 56 is scanned by an electron beam in the X direction on the mask 22 as shown in FIG. 4B, and it also imparts a first mode instruction such that the electron beam can be deflected at high speeds. The area 56 of the photoresist layer on the mask 22 is scanned a distance (corresponding to a width SW of 250 μm) at a high speed by an electron beam with a relatively large diameter $D_1$ (1.0 μm) as shown in FIG. 4B. Then, the table 20 is moved a distance of $D_1$ (1.0 μm) in the Y direction and scanning is likewise effected. In this way, scanning is repeated and the exposure of the first area is completed.

The exposure of the second area 58 proceeds in the second operation mode. In the second operation mode the size $D_2$ of an electron beam incident onto the photoresist layer on the mask 22 is relatively small i.e. of the order of 0.5 μm as in FIG. C and the scanning width SW is 250 μm as in the case of the first operation mode. The area 58 is scanned by an electron beam in the X direction at a normal scaning speed. Then, the table 20 is moved at a distance of 0.5 μm in the Y direction and scanning is effected. In this way, scanning is repeated and the exposure of the second area is completed. It will be understood that in either of the first and second operation mode a pattern signal designated by the computer on the X, Y coordinate is sent to the blanking control unit 26 to permit passage of an electron beam between the blanking electrodes 12 to be blocked or unblocked. Since the first area 56 is exposed at high speed by an electron beam with a relatively larger diameter, the exposure time is relatively brief as compared with the exposure time involved at the second area 58. The width (1×250μ) with which the first area 56 is scanned once in the X direction is two times as large as the width with which the second area 58 is scanned once in the X direction. The speed at which the first area 56 is scanned is two times as fast as the speed at which the second area 58 is scanned. As a result, the exposure of the first area 56 is completed at one-fourth the exposure time of the second area 58. Furthermore, the second area 58 is exposed by an electron beam of sufficiently smaller diameter according to the accuracy with which a circuit pattern is described, thus assuring an accurate pattern description.

An exposure method based on a vector scanning system will be sufficiently surmised from the exposure method using the raster scanning system and further explanation will therefore emitted. The vector scanning system is similar to the raster scanning system in respect of using different beam widths with which the first and second areas 56 and 58 are respectively exposed.

Figure 5:
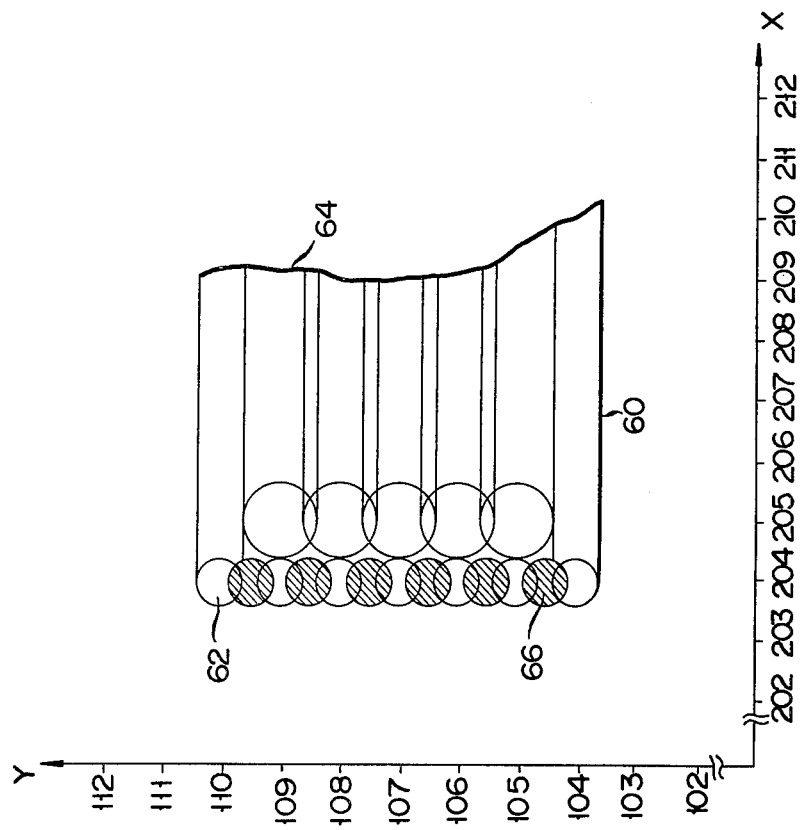
FIG. 5 is an explanatory view showing another electron beam exposing method in which different diameters of electron beams are used.

Another aspect of this invention will now be explained below. In this method, as shown in FIG. 5 a first area 62 i.e. the marginal portion of a circuit pattern to be described on the photoresist layer on the mask 22 is exposed by an electron beam with a relatively small diameter of, for example, 0.6 μm and a second area 64 i.e. the remaining inner portion of the circuit pattern is exposed by an electron beam with a relatively large diameter of, for example, 1.4 μm. In the raster scanning system, for example, the pattern portion corresponding to X 100 to X 500 addresses is scanned in the X direction and each time one scanning is effected in the X direction the mask 22 is moved one address distance by the table. Now suppose that the marginal portion 60 of a circuit pattern to be described is a rectangular pattern of which X addresses are numbered 204 to 214 and of which Y addresses are numbered 104 to 110. When such a rectangular pattern is to be described, the computer 34 gives an instruction to the table moving control unit 30 and the table 20 is continuously moved by the table moving unit 32 to cause the mask 22 to be moved to a predetermined position so that a Y 103 address is scanned in the X direction. Since at this time no corresponding pattern is present on the Y 103 address position an deflected electron beam is supposed to continue a blanking operation. In one aspect of this invention, however, when the electron beam scanning position reaches a Y 103-X 204 address position it is adjusted to have a diameter of 0.6μ and, deflected a 1μ distance by the deflection electrodes 14 and 16 in the Y direction to cause it to be directed to a Y 104-X 204 area. The electron beam is unblanked by the blanking electrode 12 and the area on Y 104 line is scanned in the X direction by the unblanked electron beam. As a result, the pattern portion of Y 104 line is exposed by the deflected electron beam in FIG. 5. Then, the table 20 is moved a 1μ distance in the Y direction and the scanning position is set to the X line including the Y 104 address position. This time, an undeflected electron beam is blanked up to an X 203 address position and an unblanking operation is effected from the X 204 address position to X 214 address position. As a result, a band-like zone as indicated by FIG. 5 is twice exposed on the X line including the Y 104 address position. Then, the table 20 is moved a 1μ distance and the scanning position is set to a Y 105 address position. The electron beam resumes its blanking operation and, when the X 203 is designated as a scanning spot, the electron beam is unblanked and deflected a −0.5μ distance by the deflection electrodes 14 and 16 in the Y direction to cause it to be directed to a Y 104.5-X 204 area. As a result, the Y 104.5-X 204 area as indicated by the shaded circle is exposed by an electron beam with a diameter of 0.6 μm. Then, an unshaded circle portion on the Y 105-X 204 address position is exposed by an undeflected electron beam. After exposure of the Y 105-X 204 address position, the electron beam is adjusted to have a diameter of 1.4μ. The 1.4μ-diameter electron beam continuously expose X 205 to X 213 address positions and then it is adjusted to have a diameter of 0.6μ.

Such an operation is repeated. As a result, the shaded circle on the 0.5 Y address area and unshaded circle on the Y address position are exposed. In this way, those areas on the X, Y coordinate which are not exposed by the undeflected electron beam are accurately exposed using the address position on the X, Y coordinate to which no exposing instruction is given. However, there is a risk that those shaded and unshaded circles (the first area 62) exposed in the Y direction by the smaller-diameter electron beam will be underexposed as already set out above. In this case, those underexposed areas can be exposed a plurality of times (two or more times) by an electron beam, using those address positions on the X, Y coordinate which are located outside a pattern area. By so doing, those underexposed areas can be exposed with a necessary intensity.

Figure 6:
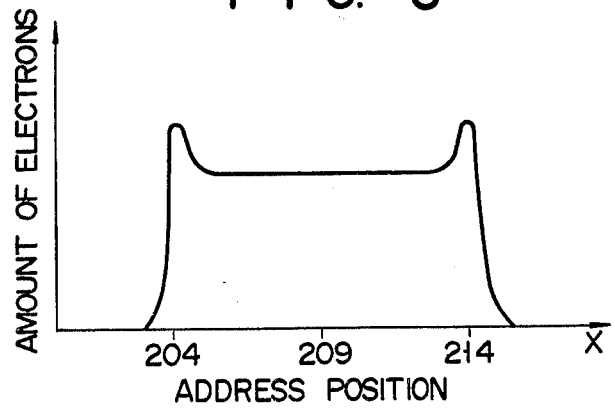
FIG. 6 is a graph showing a relation of X address positions on an X axis line including a specific Y address position to an exposed amount of electron beam on the same X axis line on a coordinate of FIG. 5.

The above-mentioned operation is based on the raster scanning system, but in the vector scanning system an exposing method is more simplified. That is, the first area 62 is exposed by an electron beam with a diameter of 0.6μ and then the second area 64 enclosed by the first area can be exposed. FIG. 6 is a graph showing a relation of an amount of electron beam on the line including the Y 107 address position on the X, Y coordinate to X address positions on the same line. As will be understood from FIG. 6 an amount of electron beam directed to the marginal portion (the first area) of a circuit pattern can be increased according to the exposing method of this invention. As a result, a photoresist layer on the mask can be uniformly exposed and an accurate pattern can be described.

When the photoresist layer is exposed with a uniform amount of electron beam a proximity effect occurs by a reflection electron or a secondary electron in a large pattern or in an area high in pattern density. As a result, the area high in pattern density or the central portion of the larger pattern will be intense in its amount of electron beam and the area low in pattern density or the marginal portion of the larger pattern will be weak in its amount of electron beam. If an amount of electron beam exposed to the photoresist layer is too intense or too week, an accurate pattern can not be developed. According to the exposing method of this invention a pattern area is divided into areas and the diameter of the electron beam, as well as an exposed amount of radiation beam, is determined according to the exposure areas. Since the respective area of the pattern is exposed by a corresponding radiation beam an accurate pattern can be formed on the photoresist layer on the mask.

Although in the above-mentioned embodiment the pattern is divided into two areas, this invention can be restricted thereto. It is needless to say that the pattern can be divided three or more areas as required. In this case, the diameter of an electron beam, as well as the exposed amount of electron beam, can be selected according to the pattern areas.

What is claimed is:

1. Electron beam exposing apparatus comprising;
   an electron gun for emitting an electron beam,
   an electron lens system for focussing an electron beam,
   a table means on which an object to be exposed by an electron beam is placed,
   blanking means for selectively preventing passage of the electron beam to permit the electron beam to be selectively exposed onto the object on the table, deflection means for deflecting the electron beam in a predetermined direction to cause it to be directed to a predetermined area of the object, means for controlling the electron gun to cause the diameter of an electron beam at a crosspoint which is emitted from the electron gun to be varied to a predetermined value, and means for designating the value of a diameter of the electron beam to said control means according to the area of a pattern to be described on the object.

2. Electron beam exposing apparatus as claimed in claim 1 in which said electron gun comprises a bar-like emitter having a relatively sharp end from which an electron is emitted, a heater for heating the emitter, a wehnelt electrode disposed near to the end of the emitter and a grounded anode disposed in direction of emission of the electron beam such that it is spaced apart from the wehnelt electrode, said electron beam exposing apparatus further including a DC power source for supplying a heater current to the heater, a high voltage source for supplying a negative high voltage to the wehnelt electrode and a resistor connected between the high voltage source and the heater to supply a voltage between the emitter and the wehnelt electrode, said control means being means for controllably adjusting a voltage supplied to the heater of the DC power source.

3. Electron beam exposing apparatus as claimed in claim 1, in which said electron gun comprisis a bar-like emitter having a relatively sharp end from which an electron beam is emitted, a heater for heating the emitter, a wehnelt electrode disposed close to the end of the emitter and a grounded anode disposed in a direction of emission of the electron beam such that it is spaced apart from the wehnelt electrode, said electron beam exposing apparatus including a DC power source for supplying a heater current to the heater, a high voltage source for supplying a negative high voltage to the wehnelt electrode and a resistor connected between the high voltage source and the heater to supply a voltage between the emitter and the wehnelt electrode, said control means being means for varying a resistive value of the register to controllably adjust a voltage supplied between the emitter and the wehnelt electrode.

4. Electron beam exposing apparatus as claimed in claim 2 or 3 in which said emitter is made of one of a single crystal of lanthanum hexaboride a single crystal of thorium-bearing tungsten, a sintered mass of lanthanum hexaboride and a sintered mass of a thorium-bearing tungsten.

5. Electron beam exposing apparatus as claimed in claim 1, further including a table moving unit for moving the table means in a predetermined direction and a table moving control unit for controlling the drive of the table moving unit, said blanking means comprising a pair of blanking electrodes between which the electron beam is incident and a blanking control unit for controlling a voltage supplied between the blanking electrodes to selectively prevent passage of the electron beam, said deflection means comprising a pair of deflection electrodes between which an electron beam is incident and a deflection control unit for varying a voltage across the deflection electrodes to cause the locus of the electron beam to be varied, said beam diameter designating means further including means for storing data on the position of the object, data on a pattern to be described on the object and data on the diameter of the beam and for providing said position data to the table moving control unit and deflction control unit, said pattern data to said blanking control unit and said diameter data associated with said pattern data and said position data to said beam diameter controlling means.

6. Electron beam exposing apparatus as claimed in claim 1 in which said beam diameter designating means is provided for varying the diameter of the electron beam when a pattern to be described on the object is a mark pattern and giving an instruction for supplying relatively great beam diameter data to said beam diameter controlling means and for varying the diameter of the electron beam when a pattern to be described on the object is a circuit pattern and giving an instruction for supplying a relatively small beam diameter data to said beam diameter controlling means.

7. Electron beam exposing apparatus as claimed in claim 1, in which said beam diameter designating means is provided for varying the diameter of the electron beam when a pattern portion to be described on the object is a marginal portion of the pattern and giving an instruction for supplying relatively small beam diameter data to said beam diameter controlling means and for changing the diameter of the electron beam when the pattern portion is an inner area enclosed by said marginal portion of the pattern and giving an instruction for giving relatively large beam diameter data to said beam diameter controlling means.

8. Electron beam exposing apparatus as claimed in claim 1, which is based on a raster scanning system.

9. Electron beam exposing apparatus as claimed in claim 1, which is based on a vector scanning system.

10. An electron beam exposing method comprising the steps of beforehand storing data on the shape of a pattern to be described on an object, data on the position on the object and data on the diameter of the electron beam to be exposed onto the object and varying the diameter of an electron beam at the crossover point to provide the the electron beam diameter data which is associated with the position on the object to means for controlling the value of the electron beam diameter at the crossover point to permit the diameter of the electron beam to be exposed onto the object to be set to a predetermined value, and projecting the electron beam onto the object according to the data on the shape of the pattern which is associated with the position data.

11. Electron beam exposing method as claimed in claim 10, in which when a pattern to be described onto the object is a mark pattern an electron beam with a relatively great diameter is projected onto the object and when a pattern to be described onto the object is a circuit pattern an electron diameter with a relatively small diameter is projected.

12. Electron beam exposing method as claimed in claim 11 in which when the marginal portion of a pattern to be described onto the object is exposed an electron beam with a relatively small diameter is projected and when an internal portion enclosed by the marginal portion of the pattern is exposed an electron beam with a relatively large diameter is projected onto the object.

* * * * *